United States Patent
Peng

(10) Patent No.: US 12,082,478 B2
(45) Date of Patent: Sep. 3, 2024

(54) DISPLAY PANEL AND DISPLAY DEVICE COMPRISING TRANSLUCENT CATHODE LAYER, TRANSPARENT CATHODE LAYER, AND BLACK CATHODE LAYER

(71) Applicants: Wuhan China Star Optoelectronics Technology Co., Ltd., Hubei (CN); Wuhan China Star Optoelectronics Semiconductor Display Technology Co., Ltd., Hubei (CN)

(72) Inventor: Jiuhong Peng, Hubei (CN)

(73) Assignees: Wuhan China Star Optoelectronics Technology Co., Ltd., Wuhan (CN); Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 0 days.

(21) Appl. No.: 17/298,628

(22) PCT Filed: May 18, 2021

(86) PCT No.: PCT/CN2021/094281
§ 371 (c)(1),
(2) Date: May 31, 2021

(87) PCT Pub. No.: WO2022/236847
PCT Pub. Date: Nov. 17, 2022

(65) Prior Publication Data
US 2024/0130205 A1 Apr. 18, 2024

(30) Foreign Application Priority Data

May 8, 2021 (CN) .......................... 202110501820.9

(51) Int. Cl.
*H10K 59/80* (2023.01)
*H10K 59/122* (2023.01)
(Continued)

(52) U.S. Cl.
CPC ....... *H10K 59/8792* (2023.02); *H10K 59/122* (2023.02); *H10K 59/80524* (2023.02);
(Continued)

(58) Field of Classification Search
None
See application file for complete search history.

(56) References Cited

U.S. PATENT DOCUMENTS

| 2007/0222371 A1 | 9/2007 | Raychaudhuri et al. |
| 2008/0150421 A1* | 6/2008 | Takata ................... H10K 50/86 |
| | | 313/504 |

(Continued)

FOREIGN PATENT DOCUMENTS

| CN | 102394274 | 3/2012 |
| CN | 103400940 | 11/2013 |

(Continued)

*Primary Examiner* — Daniel Whalen

(57) ABSTRACT

The present application provides a display panel and a display device. The display panel includes a substrate, a pixel definition layer, a light emitting layer, and a cathode layer. The pixel definition layer is disposed on a side of the substrate. The pixel definition layer includes a pixel aperture region and a non-pixel aperture region. The light emitting layer is disposed in the pixel aperture region. The cathode layer includes a black cathode layer. The black cathode layer covers the non-pixel aperture region. The black cathode layer is configured to absorb light to improve contrast and color purity of the display panel and the display device.

16 Claims, 6 Drawing Sheets

(51) Int. Cl.
*H10K 102/00* (2023.01)
*H10K 102/10* (2023.01)

(52) U.S. Cl.
CPC ......... *H10K 59/873* (2023.02); *H10K 59/879* (2023.02); *H10K 2102/103* (2023.02); *H10K 2102/351* (2023.02)

(56) References Cited

U.S. PATENT DOCUMENTS

| | | | | |
|---|---|---|---|---|
| 2018/0219173 | A1* | 8/2018 | Dong | H10K 50/82 |
| 2021/0399264 | A1* | 12/2021 | Ueda | H10K 50/858 |

FOREIGN PATENT DOCUMENTS

| | | |
|---|---|---|
| CN | 106654047 | 5/2017 |
| CN | 208062053 | 11/2018 |
| CN | 111276515 | 6/2020 |
| CN | 111354862 | 6/2020 |
| CN | 111370592 | 7/2020 |
| CN | 111789210 | 10/2020 |
| CN | 111799313 | 10/2020 |
| CN | 112582570 | 3/2021 |
| CN | 112750962 | 5/2021 |

* cited by examiner

DISPLAY PANEL AND DISPLAY DEVICE COMPRISING TRANSLUCENT CATHODE LAYER, TRANSPARENT CATHODE LAYER, AND BLACK CATHODE LAYER

RELATED APPLICATIONS

This application is a National Phase of PCT Patent Application No. PCT/CN2021/094281 having International filing date of May 18, 2021, which claims the benefit of priority of Chinese Patent Application No. 202110501820.9 filed on May 8, 2021. The contents of the above applications are all incorporated by reference as if fully set forth herein in their entirety.

FIELD AND BACKGROUND OF THE INVENTION

The present application relates to a field of displays, especially to a display panel and a display device.

With the continuous development of display technology, organic light emitting diode (OLED) display technology, as a new type of display technology, has the advantages of self-luminescence, wide viewing angles, high contrast, low power consumption, and high response speed, and it attracts more and more attention of people. However, during transmission, light generated internally from a conventional OLED display panel interferes with emitted light of adjacent sub-pixels such that contrast and color purity of the display panel and the display device are affected.

SUMMARY OF THE INVENTION

Technical Issue

The present application provides a display panel and a display device to improve contrast and color purity of the display panel and the display device.

Technical Solution

A display panel provided by the present application comprises:
  a substrate;
  a pixel definition layer, wherein the pixel definition layer is disposed on a side of the substrate, and the pixel definition layer comprises a pixel aperture region and a non-pixel aperture region;
  a light emitting layer, wherein the light emitting layer is disposed in the pixel aperture region; and
    a cathode layer, wherein the cathode layer comprises a black cathode layer, the black cathode layer covers the non-pixel aperture region, and the black cathode layer is configured to absorb light.

In some embodiments of the present application, the cathode layer further comprises a translucent cathode layer and a transparent cathode layer, the translucent cathode layer covering the non-pixel aperture region, the transparent cathode layer covering the translucent cathode layer and the light emitting layer, and the black cathode layer covering the transparent cathode layer located in the non-pixel aperture region.

In some embodiments of the present application, a thickness of the translucent cathode layer is 5 nanometers to 10 nanometers, and a phase angle of reflected light between the black cathode layer and the translucent cathode layer is 120° to 240°.

In some embodiments of the present application, a refractive index of the translucent cathode layer is greater than a refractive index of the transparent cathode layer, and the refractive index of the transparent cathode layer is greater than a refractive index of the black cathode layer.

In some embodiments of the present application, material of the black cathode layer is at least one of $CdGeP_2$, $ZnGeP_2$, or $MnGeP_2$.

In some embodiments of the present application, the display panel further comprises an encapsulation layer, the encapsulation layer comprises a first lens layer, a second lens layer, and a third lens layer; and
  wherein the first lens layer covers the pixel aperture region, and is disposed on a side of the cathode layer away from the light emitting layer, the second lens layer is disposed on a side of the first lens layer away from the cathode layer, and the third lens layer is disposed on a side of the second lens layer away from the first lens layer.

In some embodiments of the present application, the first lens layer comprises a plurality of first lenses, the second lens layer comprises a plurality of second lenses, the third lens layer comprises a plurality of third lenses, and a diameter of the first lenses is greater than a diameter of the second lenses, and the diameter each of the second lenses is greater than a diameter of the third lenses.

In some embodiments of the present application, the second lenses are arranged orthogonally or arranged hexagonally on surfaces of the first lenses, and the third lenses are arranged orthogonally or arranged hexagonally on surfaces of the second lenses.

In some embodiments of the present application, the display panel further comprises driver circuit layer, the driver circuit layer is disposed between the substrate and the pixel definition layer.

In some embodiments of the present application, the display panel further comprises spacer, and the spacer is disposed on a side of the pixel definition layer away from the driver circuit layer.

The present application also provides a display device, the display device comprises a display panel, the display panel comprises:
  a substrate;
  a pixel definition layer, wherein the pixel definition layer is disposed on a side of the substrate, and the pixel definition layer comprises a pixel aperture region and a non-pixel aperture region;
  a light emitting layer, wherein the light emitting layer is disposed in the pixel aperture region; and
  a cathode layer, wherein the cathode layer comprises a black cathode layer, the black cathode layer covers the non-pixel aperture region, and the black cathode layer is configured to absorb light.

In some embodiments of the present application, the cathode layer further comprises a translucent cathode layer and a transparent cathode layer, the translucent cathode layer covering the non-pixel aperture region, the transparent cathode layer covering the translucent cathode layer and the light emitting layer, and the black cathode layer covering the transparent cathode layer located in the non-pixel aperture region.

In some embodiments of the present application, a thickness of the translucent cathode layer is 5 nanometers to 10 nanometers, and a phase angle of reflected light between the black cathode layer and the translucent cathode layer is 120° to 240°.

In some embodiments of the present application, a refractive index of the translucent cathode layer is greater than a refractive index of the transparent cathode layer, and the refractive index of the transparent cathode layer is greater than a refractive index of the black cathode layer.

In some embodiments of the present application, material of the black cathode layer is at least one of $CdGeP_2$, $ZnGeP_2$, or $MnGeP_2$.

In some embodiments of the present application, the display panel further comprises an encapsulation layer, the encapsulation layer comprises a first lens layer, a second lens layer, and a third lens layer; and wherein the first lens layer covers the pixel aperture region, and is disposed on a side of the cathode layer away from the light emitting layer, the second lens layer is disposed on a side of the first lens layer away from the cathode layer, and the third lens layer is disposed on a side of the second lens layer away from the first lens layer.

In some embodiments of the present application, the first lens layer comprises a plurality of first lenses, the second lens layer comprises a plurality of second lenses, the third lens layer comprises a plurality of third lenses, and a diameter of the first lenses is greater than a diameter of the second lenses, and the diameter each of the second lenses is greater than a diameter of the third lenses.

In some embodiments of the present application, the second lenses are arranged orthogonally or arranged hexagonally on surfaces of the first lenses, and the third lenses are arranged orthogonally or arranged hexagonally on surfaces of the second lenses.

In some embodiments of the present application, the display panel further comprises driver circuit layer, the driver circuit layer is disposed between the substrate and the pixel definition layer.

In some embodiments of the present application, the display panel further comprises spacer, and the spacer is disposed on a side of the pixel definition layer away from the driver circuit layer.

Advantages

The present application provides a display panel and a display device. The display panel comprises: a substrate, a pixel definition layer, a light emitting layer, and a cathode layer. The pixel definition layer is disposed on a side of the substrate. The pixel definition layer comprises a pixel aperture region and a non-pixel aperture region. The light emitting layer is disposed in the pixel aperture region. The cathode layer comprises a black cathode layer. The black cathode layer covers the non-pixel aperture region. The black cathode layer is configured to absorb light to avoid interference of the emitted light of adjacent sub-pixels such that contrast and color purity of the display panel and the display device are improved.

BRIEF DESCRIPTION OF THE SEVERAL VIEWS OF THE DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

DESCRIPTION OF SPECIFIC EMBODIMENTS OF THE INVENTION

The technical solution in the embodiment of the present application will be clearly and completely described below with reference to the accompanying drawings in the embodiments of the present application. Apparently, the described embodiments are merely some embodiments of the present application instead of all embodiments. According to the embodiments in the present application, all other embodiments obtained by those skilled in the art without making any creative effort shall fall within the protection scope of the present application.

It should be noted that the terms "first," "second," and "third" mentioned in the present application do not represent any order, quantity or importance, but are used to distinguish different parts. In the figure, structurally similar units are indicated by the reference numbers.

During transmission, because light emitted by the light emitting layer interferes with light emitted by adjacent sub-pixels, contrast and color purity of the display panel are affected. The present application provides a display panel that can improve contrast and color purity of the display panel and the display device. The present application would be described in detail in conjunction with the specific embodiments as follows.

Figure 1:
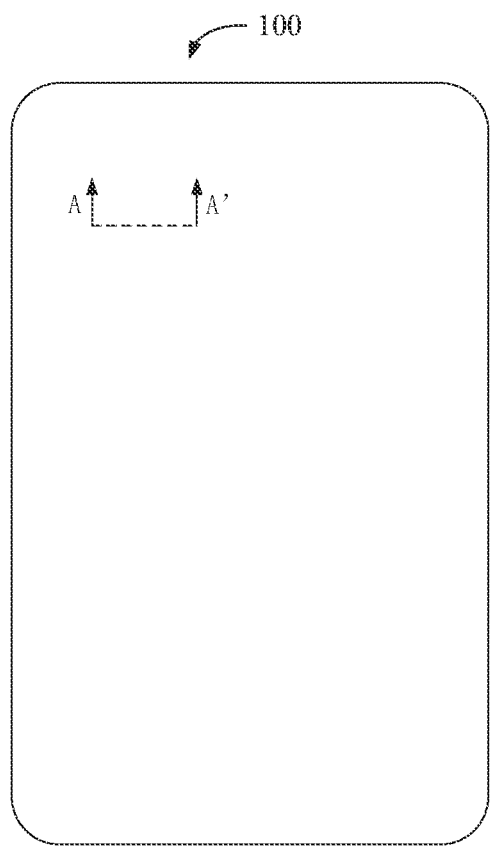
FIG. 1 is a schematic structural plan view of a first embodiment of a display panel provided by the present application.
Figure 2:
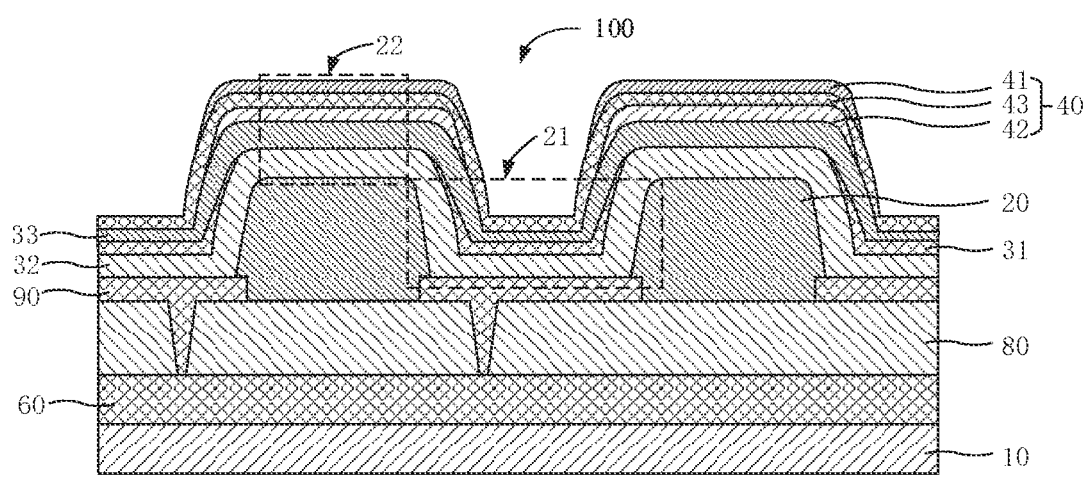
FIG. 2 is a cross-sectional view of a first embodiment of the display panel provided by the present application along line A-A'.

With reference to FIGS. 1 to 2, FIG. 1 is a schematic structural plan view of a first embodiment of the display panel provided by the present application. FIG. 2 is a cross-sectional view of a first embodiment of the display panel provided by the present application along line A-A'.

The display panel 100 comprises a substrate 10, a pixel definition layer 20, a light emitting layer 31, and a cathode layer 40. The substrate 10 can be a glass substrate or a flexible substrate. The flexible substrate can be formed by polyimide (PI), polyethylene naphthalate (PEN), polyethylene terephthalate (PET), polyarylate (PAR), polycarbonate (PC), polyetherimide (PEI), or polyethersulfone (PES). The pixel definition layer 20 is disposed on a side of the substrate 10, pixel definition layer 20 comprises a pixel aperture region 21 and a non-pixel aperture region 22. The pixel definition layer 20 can be manufactured by an ink jet printing process or an evaporation process. The light emitting layer 31 is disposed in the pixel aperture region 21. The light emitting layer 31 can be formed by an evaporation process or an ink jet printing process. The light emitting layer 31 can be formed by host-guest doping organic light emitting material. The cathode layer 40 comprises a black cathode layer 41, the black cathode layer 41 covers the non-pixel aperture region 22, and the black cathode layer 41 is configured to absorb light.

The present application, by disposing the black cathode layer 41 covering the non-pixel aperture region 22, can absorb light emitted from the light emitting layer 31 to the non-pixel aperture region 22, prevent interference of the emitted light such contrast and color purity of the display panel 100 are improved. Furthermore, the black cathode layer 41 can also absorb light incident on the display panel 100 from outside, which reduces reflected light of the display panel 100 and improves a uniform blackness effect of the display panel 100.

In some embodiments of the present application, the cathode layer 40 further comprises a translucent cathode layer 42 and a transparent cathode layer 43. The translucent cathode layer 42 covers the non-pixel aperture region 22. The transparent cathode layer 43 covers the translucent cathode layer 42 and the light emitting layer 31. The black cathode layer 41 covers the transparent cathode layer 43 in the non-pixel aperture region 22.

The translucent cathode layer 42 can be manufactured by an evaporation or vapor deposition process, and the translucent cathode layer 42 can be formed by lithium fluoride (LiF), magnesium silver (Mg—Ag) alloy, or aluminum lithium (Al—Li) alloy. The transparent cathode layer 43 can be manufactured by an evaporation process or a vapor deposition process. The transparent cathode layer 43 can be formed by indium tin oxide (ITO) or indium zinc oxide (IZO).

In some embodiments of the present application, a thickness of the translucent cathode layer 42 is 5 nanometers to 10 nanometers. A phase angle of reflected light between the black cathode layer 41 and the translucent cathode layer 42 is 120° to 240°.

Specifically, a thickness of the translucent cathode layer 42 can be 5 nanometers, 6 nanometers, 7 nanometers, 8 nanometers, 9 nanometers, or 10 nanometers. Specifically, a phase angle of reflected light between the black cathode layer 41 and the translucent cathode layer 42 can be 120°, 150°, 180°, 210°, or 240°. The present application, by controlling the thickness of the translucent cathode layer 42 to be 5 nanometers to 10 nanometers, and further controlling a phase angle of reflected light between the black cathode layer 41 and the translucent cathode layer 42 to be 120° to 240°, forms interference between first reflected light formed on the translucent cathode layer 42 by light emitted from the light emitting layer 31 and second reflected light formed on the black cathode layer 41 by light emitted from the light emitting layer 31, weakens intensity of light emitted from the light emitting layer 31 into non-pixel aperture region 22 such that contrast and color purity of the display panel 100 are improved.

In some embodiments of the present application, a refractive index of the translucent cathode layer 42 is greater than a refractive index of the transparent cathode layer 43. The refractive index of the transparent cathode layer 43 is greater than a refractive index of the black cathode layer 41.

A refractive index of material refers to a ratio of a transmission speed of light in a vacuum to a transmission speed of the light in the medium. The greater the refractive index of material is, the stronger a capability of refracting incident light is. Light is emitted from a relative optical denser medium to a relative optically thinner medium, and an incident angle is greater than critical angle (a refraction angle is 90°) such that total reflection can occur. The present application controls the refractive index of the translucent cathode layer 42 to be greater than the refractive index of the transparent cathode layer 43 and controls the refractive index of the transparent cathode layer 43 to be greater than the refractive index of the black cathode layer 41, when an angle of outgoing light of the light emitting layer 31 is greater than a critical angle, total reflection of light would occur in the non-pixel aperture region 22 such that color purity and contrast of the display panel 100 are increased.

In some embodiments of the present application, material of the black cathode layer 41 is at least one of CdGeP2, ZnGeP2, or MnGeP2.

The black cathode layer 41 can be manufactured by an evaporation or vapor deposition process. Material of the black cathode layer 41 is at least one of CdGeP2, ZnGeP2, or MnGeP2. The black cathode layer 41 is disposed in the non-pixel aperture region 22, can absorb light emitted from the light emitting layer 31 to the non-pixel aperture region 22 such that contrast and color purity of the display panel 100 are improved. Furthermore, the black cathode layer 41 can also absorb light emitted into the display panel 100 from outside, which reduces reflected light of the display panel 100 and improves a uniform blackness effect of the display panel 100.

Figure 3:
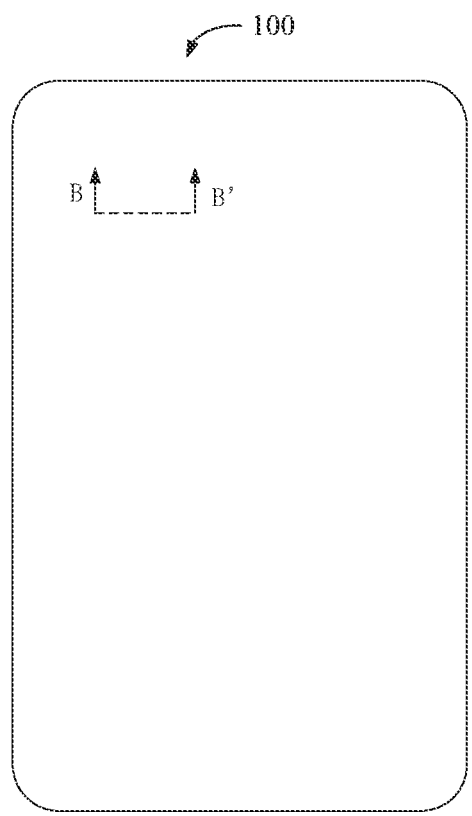
FIG. 3 is a schematic structural plan view of a second embodiment of the display panel provided by the present application.
Figure 4:
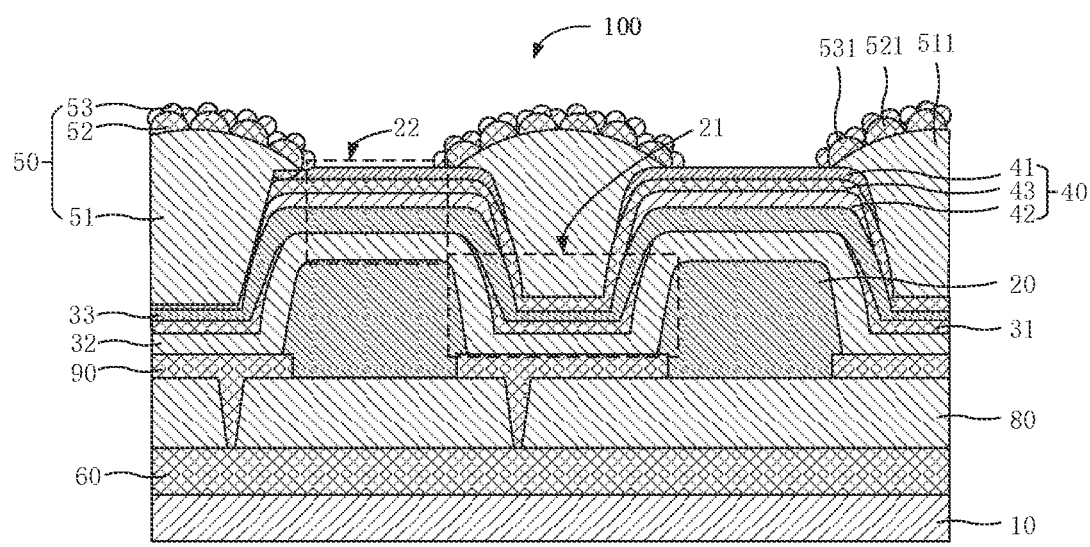
FIG. 4 is a cross-sectional view of the second embodiment of the display panel provided by the present application along line B-B'.
Figure 5:
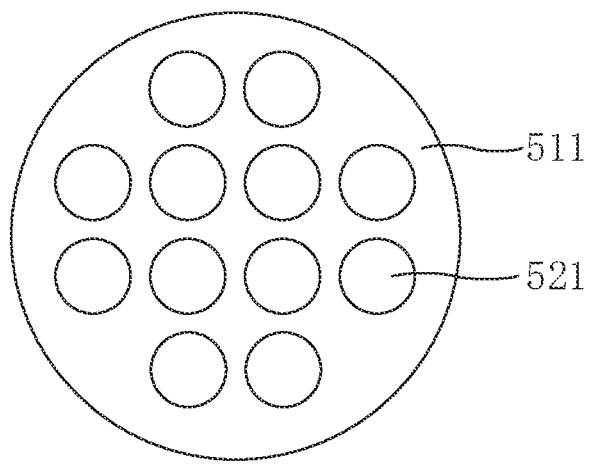
FIG. 5 is a schematic view of second lenses of the display panel provided by the present application arranged orthogonally on surfaces of first lenses.

With reference to FIGS. 3 to 4, FIG. 3 is a schematic structural plan view of a second embodiment of the display panel provided by the present application. FIG. 4 is a cross-sectional view of the second embodiment of the display panel provided by the present application along line B-B'.

In some embodiments of the present application, the display panel 100 further comprises an encapsulation layer 50. The encapsulation layer 50 comprises a first lens layer 51, a second lens layer 52, and a third lens layer 53. The first lens layer 51 covers the pixel aperture region 21, and is disposed on a side of the cathode layer 40 away from light emitting layer 31. The second lens layer 52 is disposed on a side of the first lens layer 51 away from cathode layer 40. The third lens layer 53 is disposed on a side of the second lens layer 52 away from first lens layer 51.

The encapsulation layer 50 can isolate water oxygen to prolong lifespan of the display panel 100. The first lens layer 51, the second lens layer 52, and the third lens layer 53 can be manufactured by an electrofluid ink jet printing process. The first lens layer 51, the second lens layer 52, and the third lens layer 53 can be formed by epoxy resin, polyimide (PI), polyethylene terephthalate (PET), polycarbonate (PC), polyethylene (PE), or polyacrylate. The present application, by disposing the encapsulation layer 50 in a lens shape, can concentrate light emitted by the light emitting layer 31 such that light emission intensity of the display panel 100 is improved.

The electrofluid ink jet printing is driven by a spatial electric field, and can jet droplets with an extremely small diameter. Such process can achieve printing droplets at a sub-micron level which are easily ejected and not easy to be clogged, a having a resolution that is not influenced by a diameter of a jet nozzle, and can form micro lenses in any shape.

In some embodiments of the present application, the first lens layer 51 comprises a plurality of first lenses 511, the second lens layer 52 comprises a plurality of second lenses 521. The third lens layer 53 comprises a plurality of third lenses 531. A diameter of the first lenses 511 is greater than a diameter of the second lenses 521. The diameter of the second lenses 521 is greater than a diameter of the third lenses 531.

Specifically, a diameter of the first lenses 511 is 200 microns to 500 microns. The diameter of the first lenses 511 can be 200 microns, 250 microns, 300 microns, 250 microns, 400 microns, 450 microns, or 500 microns. A diameter of the second lenses 521 is 1 microns to 100 microns. The diameter of the second lenses 521 can be 1 microns, 10 microns, 20 microns, 30 microns, 40 microns, 50 microns, 60 microns, 70 microns, 80 microns, 90 microns, or 100 microns. A diameter of the third lenses 531 is 100 nanometers to 700 nanometers. The diameter of the third lenses 531 can be 100 nanometers, 200 nanometers, 300 nanometers, 400 nanometers, 500 nanometers, 600 nanometers, or 700 nanometers. The present application, by setting the diameter of the first lenses 511 to be greater than the diameter of the second lenses 521, and setting the diameter of the second lenses 521 to be greater than the diameter of the third lenses 531, forms a structure similar to the compound eye of an insect, which effectively reduces total reflection of light emitted from the light emitting layer 31 inside the display panel 100 such that light output efficiency is increased and viewing angles of the display panel 100 is enhanced are increased.

In some embodiments of the present application. A shape of each of the first lenses 511 is semi-spherical, columnar, or prismatic. A shape of each of the second lenses 521 is semi-spherical, columnar, or prismatic. A shape of each of third lenses 531 is semi-spherical, columnar, or prismatic. In the present embodiment, semi-spherical shapes of the first lenses 511, the second lenses 521, and the third lenses 531 are taken as an example.

The present application, by disposing the shapes of the first lenses 511, the second lenses 521, and the third lenses 531 to be semi-spherical, can concentrate light emitted from the light emitting layer 31 such that brightness of the display panel 100 is increased and power consumption of the display panel 100 is decreased.

Figure 6:
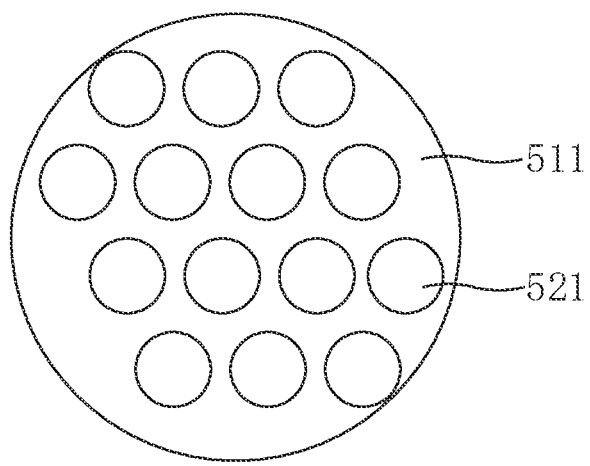
FIG. 6 is a schematic view of the second lenses of the display panel provided by the present application arranged hexagonally on the surfaces of the first lenses.
Figure 7:
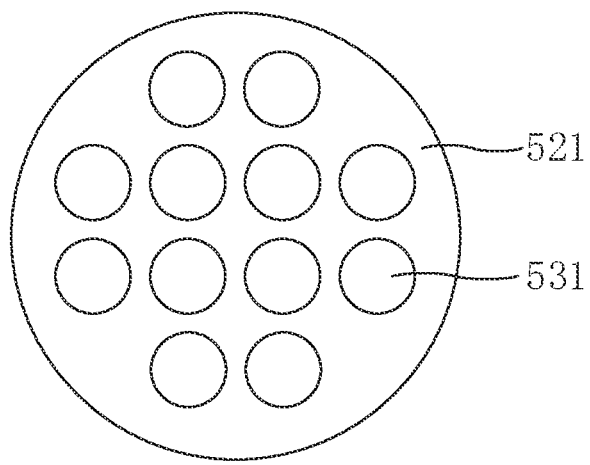
FIG. 7 is a schematic view of third lenses of the display panel provided by the present application arranged orthogonally on surfaces of the second lenses.
Figure 8:
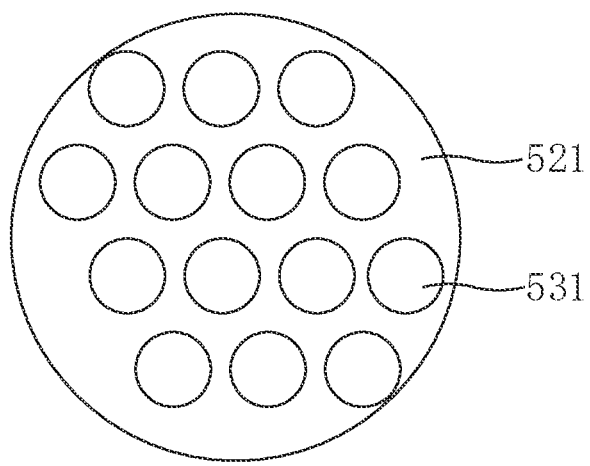
FIG. 8 is a schematic view of third lenses of the display panel provided by the present application arranged hexagonally on the surfaces of the second lenses.

With reference to FIGS. 5-8, FIG. 5 is a schematic view of second lenses of the display panel provided by the present application arranged orthogonally on surfaces of first lenses. FIG. 6 is a schematic view of the second lenses of the display panel provided by the present application arranged hexagonally on the surfaces of the first lenses. FIG. 7 is a schematic view of third lenses of the display panel provided by the present application arranged orthogonally on surfaces of the second lenses. FIG. 8 is a schematic view of third lenses of the display panel provided by the present application arranged hexagonally on the surfaces of the second lenses.

In some embodiments of the present application, the second lenses 521 are arranged orthogonally or arranged hexagonally on a surface of first lens layer 511. The third lenses 531 are arranged orthogonally or arranged hexagonally on surfaces of the second lenses 521.

In the present embodiment, a duty ratio of the orthogonally arranged second lenses 521 on the surfaces of the first lenses 511 can reach up to 78.5%. A duty ratio of the orthogonally arranged third lenses 531 on the surfaces of the second lenses 521 can reach up to 78.5%. a duty ratio of the hexagonally arranged second lenses 521 on the surfaces of the first lenses 511 can reach up to 90.7%. a duty ratio of the hexagonally arranged third lenses 521 on the surfaces of the second lenses 511 can reach up to 90.7%.

The present application, by disposing the orthogonally arranged or hexagonally arranged second lenses 521 on the surfaces of the first lenses 511, makes the second lenses 521 have the greatest duty ratio on the surfaces of the first lenses 511 and can concentrate light emitted from the light emitting layer 31 to the first lenses 511. By disposing the orthogonally arranged or hexagonally arranged third lenses 531 on the surfaces of the second lenses 521, the third lenses 531 has the greatest duty ratio on the surfaces of the second lenses 521 and can concentrate light emitted from the first lenses 511 to the second lenses 521 such that brightness of the display panel 100 is increased and power consumption of the display panel 100 is decreased.

In some embodiments of the present application, the display panel 100 further comprises a driver circuit layer 60. The driver circuit layer 60 is disposed between the substrate 10 and the pixel definition layer 20.

The driver circuit layer 60 comprises several thin film transistors. The thin film transistors comprise an active layer, a gate electrode, a source electrode, and a drain electrode. The active layer is disposed opposite to the gate electrode. The source electrode and the drain electrode are located on two sides of the active layer and are electrically connected to the active layer. The driver circuit layer 60 can drive the light emitting layer 31 to emit light to achieve normal illumination of the display panel 100.

Figure 9:
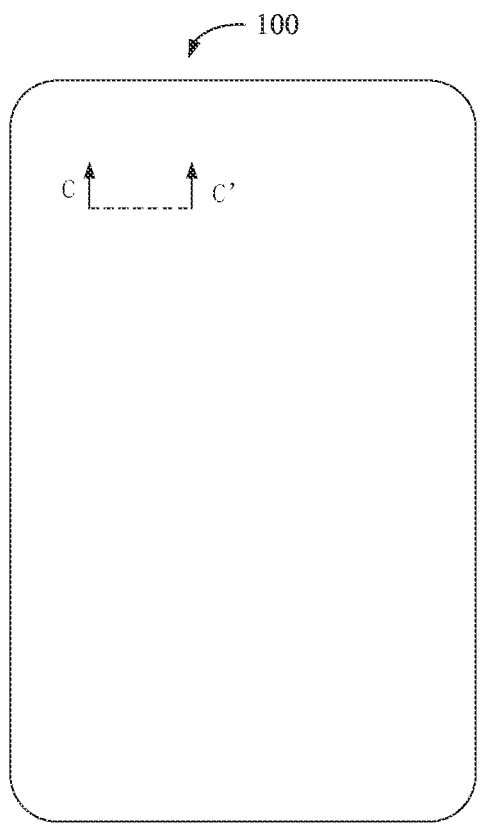
FIG. 9 is a schematic structural plan view of a third embodiment of the display panel provided by the present application.
Figure 10:
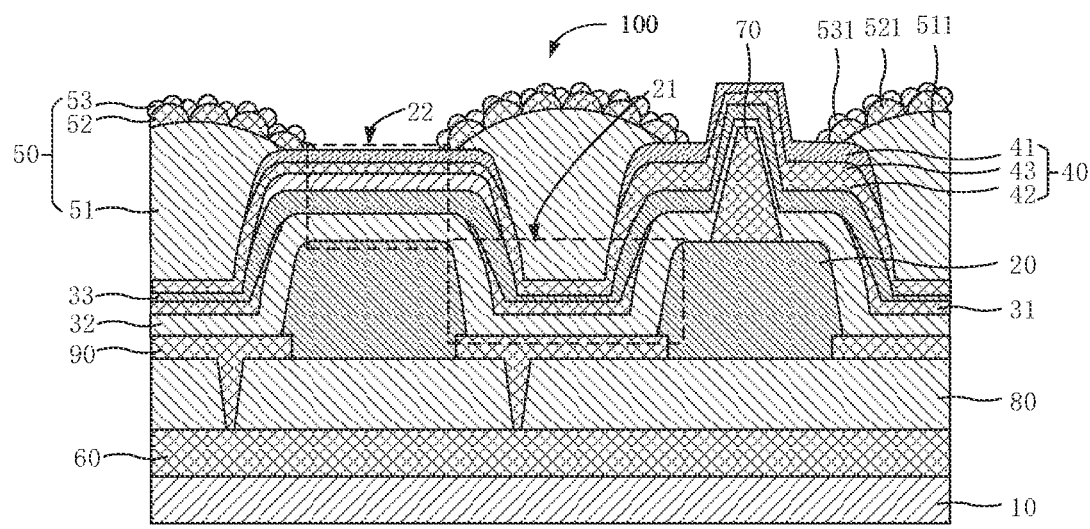
FIG. 10 is a cross-sectional view of the third embodiment of the display panel provided by the present application along line C-C'.

With reference to FIGS. 9-10, FIG. 9 is a schematic structural plan view of a third embodiment of the display panel provided by the present application. FIG. 10 is a cross-sectional view of the third embodiment of the display panel provided by the present application along line C-C'.

In some embodiments of the present application, the display panel 100 further comprises a spacer 70, the spacer 70 is disposed on a side of the pixel definition layer 20 away from driver circuit layer 60.

The spacer 70 can be manufactured with the pixel definition layer 20 during a same process, and can also be manufactured individually after manufacturing the pixel definition layer 20. The spacer 70 can be formed by epoxy resin or acrylic material. Because the light emitting layer 31 is generally organic light emitting material having fluidity, the present application, by disposing the spacer 70, can prevent organic light emitting material in the light emitting layer 31 from overflowing out of the pixel aperture region 21. Furthermore, the spacer 70 has a certain strength, and can perform a function for supporting and protecting the light emitting layer.

The display panel 100 further comprises a planarization layer 80 and an anode layer 90. The planarization layer 80 is disposed on a side of the driver circuit layer 60 away from substrate 10. The planarization layer 80 can be formed by organic photo resist material. The planarization layer 80 is defined with a hole. The anode layer 90 is disposed on a side of the planarization layer 80 away from driver circuit layer 60, and is disposed in the hole for connecting the driver circuit layer 60 and the light emitting layer 31 to achieve normal light emission of the display panel 100.

The display panel 100 further comprises a hole transport layer 32 and an electron transport layer 33. The hole transport layer 32 covers the anode layer 90 and the non-pixel aperture region 22. The electron transport layer 33 covers the light emitting layer 31 and the hole transport layer 32. The present application, by disposing the hole transport layer 32 and the electron transport layer 33, can improve light emission efficiency of the display panel 100. It can be understood that the display panel 100 can further comprise a hole injection layer and an electron injection layer. The hole injection layer is disposed between the hole transport layer 32 and the anode layer 90, the electron injection layer is disposed between the electron transport layer 33 and the cathode layer 40.

Figure 11:
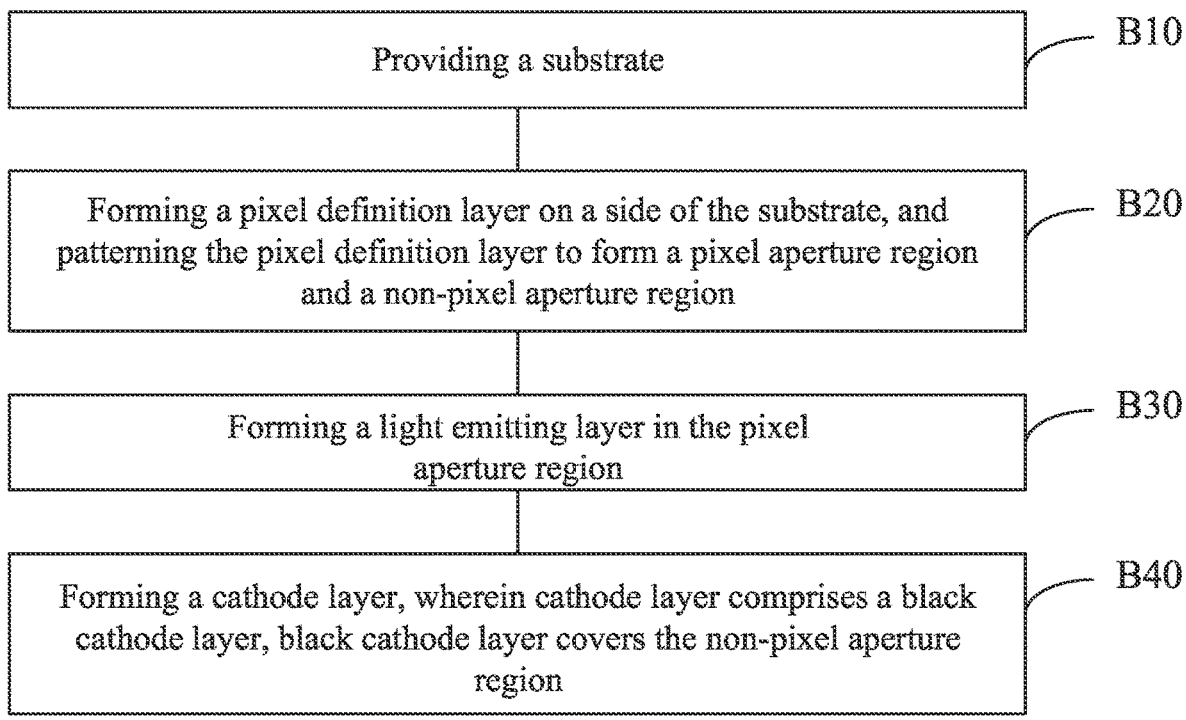
FIG. 11 is a flowchart of a manufacturing method for the display panel provided by the present application.

With reference to FIG. 11, FIG. 11 is a flowchart of a manufacturing method for the display panel provided by the present application.

Step B10: providing a substrate.

The substrate can be glass substrate or a flexible substrate. The flexible substrate can be formed by polyimide (PI), polyethylene naphthalate (PEN), polyethylene terephthalate (PET), polyarylate (PAR), polycarbonate (PC), polyetherimide (PEI), or polyethersulfone (PES).

Step B20: forming a pixel definition layer on a side of the substrate, and patterning the pixel definition layer to form a pixel aperture region and a non-pixel aperture region.

Specifically, etching the pixel definition layer to form a pixel aperture region and a non-pixel aperture region.

In some embodiments of the present application, before the step of forming a pixel definition layer on a side of the substrate and patterning the pixel definition layer to form a pixel aperture region and a non-pixel aperture region, the method can further comprise a step as follows: forming a driver circuit layer on a side of the substrate.

The driver circuit layer comprises several thin film transistors. Each of the thin film transistors comprises an active layer, a gate electrode, a source electrode, and a drain electrode. The active layer is disposed opposite to the gate electrode. The source electrode and the drain electrode are located on two sides of the active layer and are electrically connected to the active layer.

In some embodiments of the present application, before the step of forming a pixel definition layer on a side of the substrate and patterning the pixel definition layer to form a pixel aperture region and a non-pixel aperture region, the method can further comprise a step as follows: forming a planarization layer on a side of the substrate and forming a hole in the planarization layer, wherein an anode layer is formed in the hole.

B30: forming a light emitting layer in the pixel aperture region.

The light emitting layer can be formed by an evaporation process or an ink jet printing process. The light emitting layer can be formed by host-guest doping organic light emitting material.

In some embodiments of the present application, before the step of forming a light emitting layer in the pixel aperture region, the method can further comprise a step as follows: forming a hole injection layer in the pixel aperture region.

B40: forming a cathode layer, wherein cathode layer comprises a black cathode layer, the black cathode layer covers the non-pixel aperture region.

The black cathode layer can be manufactured by an evaporation or vapor deposition process. Material of the black cathode layer can be at least one of $CdGeP_2$, $ZnGeP_2$, or $MnGeP_2$.

In some embodiments of the present application, cathode layer further comprises a translucent cathode layer and a transparent cathode layer. Before the step of forming a cathode layer, wherein the cathode layer comprises a black cathode layer, and the black cathode layer covers the non-pixel aperture region, the method can further comprise a step as follows: forming a translucent cathode layer covering the non-pixel aperture region, wherein a thickness of the translucent cathode layer is 5 nanometers to 10 nanometers; and forming a transparent cathode layer covering the light emitting layer and the translucent lens cathode layer.

The thickness of the translucent cathode layer can be 5 nanometers, 6 nanometers, 7 nanometers, 8 nanometers, 9 nanometers, or 10 nanometers. A phase angle of reflected light between the black cathode layer and the translucent cathode layer is 120° to 240°. Specifically, the phase angle of reflected light of the black cathode layer and the translucent cathode layer can be 120°, 150°, 180°, 210°, or 240°.

The translucent cathode layer can be manufactured by an evaporation or vapor deposition process. The translucent cathode layer can be formed by lithium fluoride (LiF), magnesium silver (Mg—Ag) alloy or aluminum lithium (Al—Li) alloy. The transparent cathode layer can be manufactured by an evaporation or vapor deposition process. The transparent cathode layer can be formed by indium tin oxide (ITO) or indium zinc oxide (IZO). A refractive index of the translucent cathode layer is greater than a refractive index of the transparent cathode layer. The refractive index of the transparent cathode layer is greater than a refractive index of the black cathode layer.

In some embodiments of the present application, before the step of forming a cathode layer, wherein cathode layer comprises a black cathode layer, and the black cathode layer covers the non-pixel aperture region, the method can further comprise a step as follows: forming an electron transport layer on a side of the light emitting layer away from substrate.

In some embodiments of the present application, after the step of forming a cathode layer, wherein the cathode layer comprises a black cathode layer, black cathode layer covering the non-pixel aperture region, the method can further comprise a step as follows: forming a first lens layer covering the cathode layer. A second lens layer is formed on a side of the first lens layer away from cathode layer. A third lens layer is formed on a side of second lens layer away from first lens layer.

The first lens layer comprises a plurality of first lenses. second lens layer comprises a plurality of second lenses. third lens layer comprises a plurality of third lenses. A diameter of the first lenses is greater than a diameter of the second lenses. The diameter of the second lenses is greater than a diameter of the third lenses. The second lenses are arranged orthogonally or arranged hexagonally on surfaces of the first lenses. and the third lenses are arranged orthogonally or arranged hexagonally on surfaces of the second lenses. A shape of each of the first lenses is semi-spherical, columnar, or prismatic. A shape of each of the second lenses is semi-spherical, columnar, or prismatic. A shape of each of the third lenses is semi-spherical, columnar, or prismatic.

The present application improves contrast and color purity of a display panel by disposing the display panel comprising: a substrate, a pixel definition layer, a light emitting layer, and a cathode layer; the pixel definition layer is disposed on a side of the substrate and comprises a pixel definition layer, a pixel aperture region, and a non-pixel aperture region; the light emitting layer is disposed in the pixel aperture region; the cathode layer comprises a black cathode layer, wherein the black cathode layer covers the non-pixel aperture region, and the black cathode layer is configured to absorb light.

Figure 12:
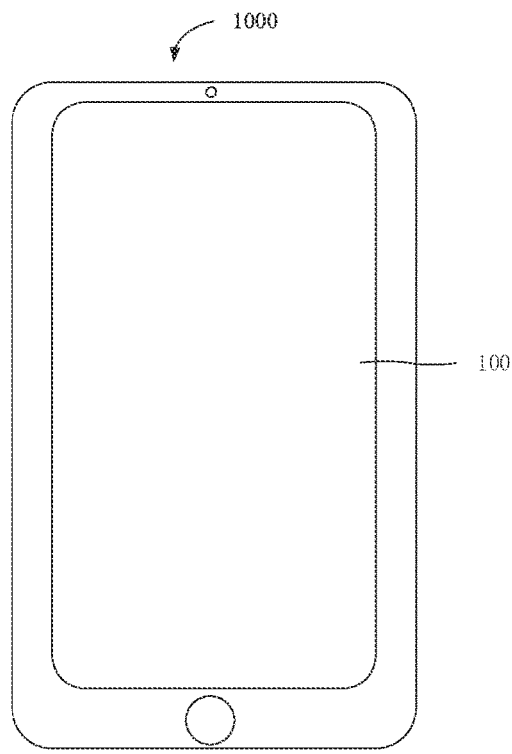
FIG. 12 is a schematic structural plan view of a display device provided by an embodiment of the present application.

With reference to FIG. 12, FIG. 12 is a schematic structural plan view of a display device provided by the embodiment of the present application.

The display device 1000 provided by the embodiment of the present application comprises a display panel 100 provided by any one of the embodiments as described above. The display device 1000 comprises but is not limited to an electrical apparatus such as a rollable or foldable mobile phone, a watch, a bracelet, a TV, or other wearable displays or touch electronic devices, and also comprises a flexible smartphone, a tablet, a laptop computer, a desktop display, a TV, smart glasses, a smartwatch, an ATM, a digital camera, a car monitor, a medical display, an industrial control display, an electronic paper book, an electrophoretic display device, a game console, a transparent display, a double-sided display, a naked-eye 3D display, a mirror display device, a transflective display device, or a flexible touch screen, etc.

The display device 1000 comprises a display panel 100, the display panel 100 comprises: a substrate, a pixel definition layer, a light emitting layer, and a cathode layer. The pixel definition layer is disposed on a side of the substrate. The pixel definition layer comprises a pixel aperture region and a non-pixel aperture region. The light emitting layer is disposed in the pixel aperture region. The cathode layer comprises a black cathode layer. The black cathode layer covers the non-pixel aperture region. The black cathode layer is configured to absorb light to improve contrast and color purity of the display panel 100 and the display device 1000.

In summary, although the detailed description of the embodiments of the present application is as above, the above-mentioned embodiments are not intended to limit the present application. Those of ordinary skill in the art should understand that they can still modify the technical solutions described in the foregoing embodiments or implement equivalent replacement of some of the technical features. These modifications or replacements do not cause the essence of the corresponding technical solutions to deviate from the scope of the technical solutions of the embodiments of the present application.

What is claimed is:

1. A display panel, comprising:
a substrate;
a pixel definition layer, wherein the pixel definition layer is disposed on a side of the substrate, and the pixel definition layer comprises a pixel aperture region and a non-pixel aperture region;
a light emitting layer, wherein the light emitting layer is disposed in the pixel aperture region; and
a cathode layer, wherein the cathode layer comprises a black cathode layer, the black cathode layer covers the non-pixel aperture region, and the black cathode layer is configured to absorb light;
wherein the display panel further comprises an encapsulation layer, the encapsulation layer comprises a first lens layer, a second lens layer, and a third lens layer;
wherein the first lens layer covers the pixel aperture region and is disposed on a side of the cathode layer away from the light emitting layer, the second lens layer is disposed on a side of the first lens layer away from the cathode layer, and the third lens layer is disposed on a side of the second lens layer away from the first lens layer;
wherein the first lens layer comprises a plurality of first lenses, the second lens layer comprises a plurality of second lenses, the third lens layer comprises a plurality of third lenses, and a diameter of the first lenses is greater than a diameter of the second lenses, and the diameter of the second lenses is greater than a diameter of the third lenses.

2. The display panel according to claim 1, wherein the cathode layer further comprises a translucent cathode layer and a transparent cathode layer, the translucent cathode layer covers the non-pixel aperture region, the transparent cathode layer covers the translucent cathode layer and the light emitting layer, and the black cathode layer covers the transparent cathode layer located in the non-pixel aperture region.

3. The display panel according to claim 2, wherein a thickness of the translucent cathode layer is 5 nanometers to 10 nanometers, and a phase angle of reflected light between the black cathode layer and the translucent cathode layer is 120° to 240°.

4. The display panel according to claim 2, wherein a refractive index of the translucent cathode layer is greater than a refractive index of the transparent cathode layer, and the refractive index of the transparent cathode layer is greater than a refractive index of the black cathode layer.

5. The display panel according to claim 1, wherein a material of the black cathode layer is at least one of CdGeP2, ZnGeP2, or MnGeP2.

6. The display panel according to claim 1, wherein the second lenses are arranged orthogonally or arranged hexagonally on surfaces of the first lenses, and the third lenses are arranged orthogonally or arranged hexagonally on surfaces of the second lenses.

7. The display panel according to claim 1, wherein the display panel further comprises a driver circuit layer, and the driver circuit layer is disposed between the substrate and the pixel definition layer.

8. The display panel according to claim 7, wherein the display panel further comprises a spacer, and the spacer is disposed on a side of the pixel definition layer away from the driver circuit layer.

9. A display device, wherein the display device comprises a display panel, and the display panel comprises:
a substrate;
a pixel definition layer, wherein the pixel definition layer is disposed on a side of the substrate, and the pixel definition layer comprises a pixel aperture region and a non-pixel aperture region;
a light emitting layer, wherein the light emitting layer is disposed in the pixel aperture region; and
a cathode layer, wherein the cathode layer comprises a black cathode layer, the black cathode layer covers the non-pixel aperture region, and the black cathode layer is configured to absorb light;
wherein the display panel further comprises an encapsulation layer, the encapsulation layer comprises a first lens layer, a second lens layer, and a third lens layer;
wherein the first lens layer covers the pixel aperture region, and is disposed on a side of the cathode layer away from the light emitting layer, the second lens layer is disposed on a side of the first lens layer away from the cathode layer, and the third lens layer is disposed on a side of the second lens layer away from the first lens layer;

wherein the first lens layer comprises a plurality of first lenses, the second lens layer comprises a plurality of second lenses, the third lens layer comprises a plurality of third lenses, and a diameter of the first lenses is greater than a diameter of the second lenses, and the diameter each of the second lenses is greater than a diameter of the third lenses.

10. The display device according to claim 9, wherein the cathode layer further comprises a translucent cathode layer and a transparent cathode layer, the translucent cathode layer covers the non-pixel aperture region, the transparent cathode layer covers the translucent cathode layer and the light emitting layer, and the black cathode layer covers the transparent cathode layer located in the non-pixel aperture region.

11. The display device according to claim 10, wherein a thickness of the translucent cathode layer is 5 nanometers to 10 nanometers, and a phase angle of reflected light between the black cathode layer and the translucent cathode layer is 120° to 240°.

12. The display device according to claim 10, wherein a refractive index of the translucent cathode layer is greater than a refractive index of the transparent cathode layer, and the refractive index of the transparent cathode layer is greater than a refractive index of the black cathode layer.

13. The display device according to claim 9, wherein a material of the black cathode layer is at least one of CdGeP2, ZnGeP2, or MnGeP2.

14. The display device according to claim 9, wherein the second lenses are arranged orthogonally or arranged hexagonally on surfaces of the first lenses, and the third lenses are arranged orthogonally or arranged hexagonally on surfaces of the second lenses.

15. The display device according to claim 9, wherein the display panel further comprises a driver circuit layer, and the driver circuit layer is disposed between the substrate and the pixel definition layer.

16. The display device according to claim 15, wherein the display panel further comprises a spacer, and the spacer is disposed on a side of the pixel definition layer away from the driver circuit layer.

* * * * *